(12) United States Patent
Goldbach et al.

(10) Patent No.: US 6,821,861 B1
(45) Date of Patent: Nov. 23, 2004

(54) METHOD FOR FABRICATING AN ELECTRODE ARRANGEMENT FOR CHARGE STORAGE

(75) Inventors: Matthias Goldbach, Dresden (DE); Thomas Hecht, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/631,554

(22) Filed: Jul. 31, 2003

Related U.S. Application Data (63) Continuation of application No. PCT/EP02/01800, filed on Feb. 20, 2002.

(51) Int. Cl.[7] .............................................. H01L 21/20
(52) U.S. Cl. ...................... 438/386; 438/387; 438/396; 257/308; 257/309
(58) Field of Search ................................ 438/386, 387, 438/396, 397, 244, 254; 257/534, 308

(56) References Cited

U.S. PATENT DOCUMENTS

| | | | |
|---|---|---|---|
| 5,047,815 A | 9/1991 | Yasuhira et al. ............ 257/303 |
| 5,106,774 A * | 4/1992 | Hieda et al. ................. 438/246 |
| 5,432,113 A * | 7/1995 | Tani ............................ 438/386 |
| 5,753,549 A * | 5/1998 | Lee ............................. 438/243 |
| 5,985,729 A | 11/1999 | Wu ............................. 438/389 |
| 6,022,786 A | 2/2000 | Franosch et al. ........... 438/398 |
| 6,417,063 B1 * | 7/2002 | Petter et al. ................ 438/386 |

FOREIGN PATENT DOCUMENTS

| | | |
|---|---|---|
| JP | 61036965 | 2/1986 |
| JP | 61056445 | 3/1989 |

* cited by examiner

*Primary Examiner*—T. Dang
(74) *Attorney, Agent, or Firm*—Jenkins, Wilson & Taylor, P.A.

(57) ABSTRACT

The invention relates to an electrode arrangement for charge storage with an external trench electrode (202; 406), embodied along the wall of a trench provided in a substrate (401) and electrically insulated on both sides in the trench by a first and a second dielectric (104; 405, 409); an internal trench electrode (201; 410), serving as counter-electrode to the external trench electrode (201; 406) and insulated by the second dielectric (104; 409) and a substrate electrode (201; 403), which is insulated by the first dielectric (104; 405) outside the trench, which serves as counter-electrode to the external trench electrode (202; 406) and is connected to the internal trench electrode (201; 410) in the upper trench region.

5 Claims, 11 Drawing Sheets

METHOD FOR FABRICATING AN ELECTRODE ARRANGEMENT FOR CHARGE STORAGE

RELATED APPLICATIONS

This application is a continuation of PCT patent application No. PCT/EP02/01800, filed Feb. 20, 2002, which claims priority to German patent application number 10108290.8, filed Feb. 21, 2001, the disclosures of each of which are incorporated herein by reference in their entirety.

TECHNICAL FIELD

The present invention relates to a method for fabricating an electrode arrangement for charge storage having an outer trench electrode, which is formed along the wall of a trench provided in a substrate and is electrically insulated in the trench on both sides by a first and second dielectric; an inner trench electrode, which insulated in the trench by the second dielectric, serves as a counterelectrode to the outer trench electrode; and a substrate electrode, which, insulated by the first dielectric outside the trench, serves as a counter electrode to the outer trench electrode and which in the upper trench region is connected to the inner trench electrode.

BACKGROUND ART

An electrode arrangement of this type is known from Patent Abstracts of Japan vol. 010, No. 221 (E-424), Aug. 2, 1986 (1986-08-02) & JP 61 056445 A (Toshiba Corp), Mar. 22, 1986 (1986-03-22).

U.S. Pat. No. 5,985,729 has disclosed an electrode arrangement for charge storage, with electrode plugs, which are connected to substrate electrodes in the lower trench region, being provided in trenches. Folded counterelectrodes are provided in the trenches, insulated by a dielectric.

In the case of dynamic random access memories, 1-transistor cells which substantially comprise a storage capacitor and a select transistor, which connects a storage electrode to a bit line of the circuit arrangement in the dynamic random access memory, are used.

An increase in the integration density is associated with a reduction in the size of the components used in, for example, dynamic random access memories, and therefore it is necessary to reduce the size of the 1-transistor cells as well. Reducing the size of the cells leads to a geometric reduction in the size of the capacitors, resulting in a reduction in the charge stored.

Conventional storage capacitors are formed, inter alia, as trench capacitors, i.e. a trench is etched into a substrate layer and a dielectric and a storage electrode, for example doped polysilicon, are introduced. The counterelectrode used is, for example, a doped silicon substrate (buried plate).

Figure 3:
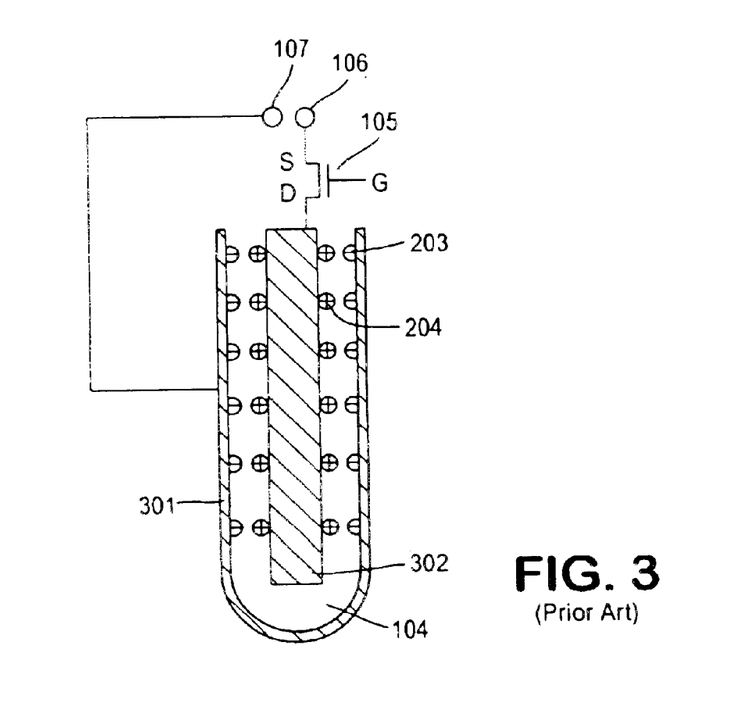
FIG. 3 shows a conventional storage capacitor.

FIG. 3 shows a trench capacitor in accordance with the prior art. In this case, a trench-like substrate electrode 301 is connected to a substrate connection device 107. A filling electrode 302 is connected to the drain terminal of a select transistor 105. A source terminal of the select transistor 105 is connected to an electrode connection device 106. The select transistor 105 is driven via a gate terminal of the select transistor 105, and can connect the filling electrode 302 to a bit line (not shown).

In the example shown in FIG. 3, the filling electrode 302 has a positive polarity, so that positive charge units 204 are located on the filling electrode 302. Accordingly, negative charge units 203 are formed on the substrate electrode 301. The total storable charge is therefore dependent on the thickness of a dielectric 104, an electrode surface area and a material constant of the dielectric.

To increase a storage capacity, it is customary to reduce the thickness of the dielectric. The thickness of the dielectric cannot be reduced arbitrarily to avoid leakage currents. A variation in the magnitude of the storage capacitance can be achieved in particular by varying the surface area of the electrode arrangement of the storage capacitor.

It is therefore a drawback of conventional electrode arrangements that, in the event of a reduction in the feature size of random access memories, a capacitor surface area and, as a result, a capacitance of storage capacitors decreases.

SUMMARY OF THE INVENTION

Therefore, it is an object of the present invention to provide a method for fabricating an electrode arrangement for charge storage which is designed in such a manner that an active surface area of the storage capacitor is increased in size.

This object is achieved by the method as claimed in claim 1.

The electrode arrangement according to the invention therefore has the advantage that the active surface area of a storage capacitor in dynamic random access memories is increased.

A further advantage of the electrode arrangement according to the invention and of the method for forming the electrode arrangement consists in the fact that it is possible to achieve smaller feature sizes without a capacitance of storage capacitors decreasing in dynamic random access memories.

Furthermore, it is advantageous that, in the electrode arrangement according to the invention and with the method according to the invention for forming an electrode arrangement for charge storage, it is not necessary to reduce a thickness of a dielectric.

An increase in the leakage current density is advantageously avoided.

The essence of the invention is an electrode arrangement for charge storage which is based on a folded storage electrode, in which the charge which can be stored is significantly increased.

The subclaims give advantageous developments of and improvements to the corresponding subject matter of the invention.

Exemplary embodiments of the invention are illustrated in the drawings and are explained in more detail in the description which follows.

DETAILED DESCRIPTION OF THE INVENTION

Figure 1:
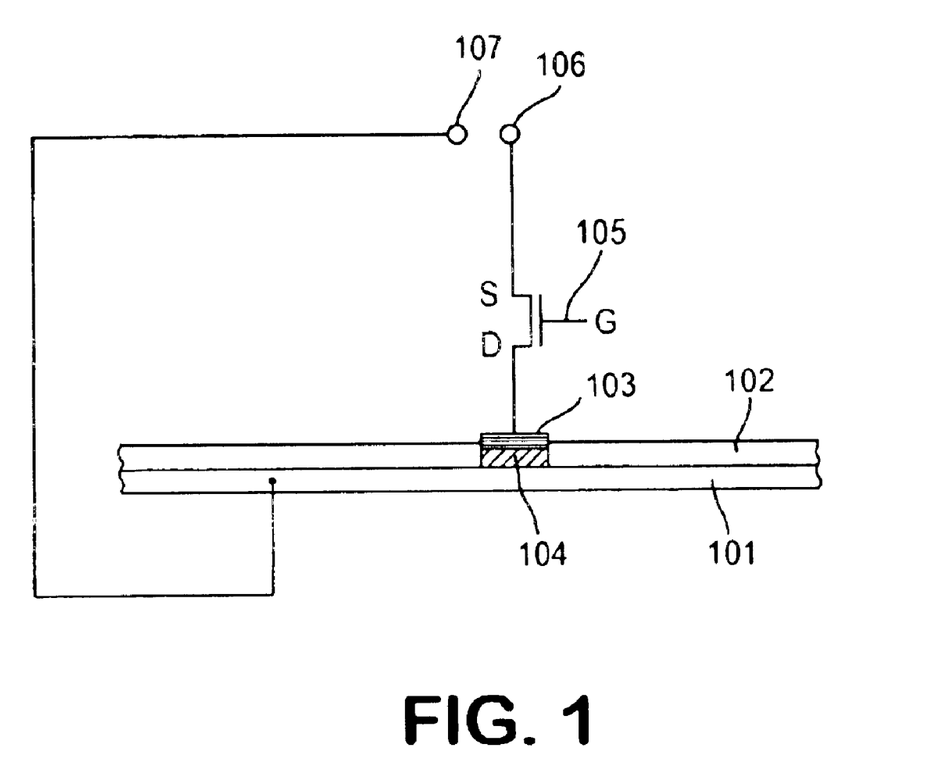
FIG. 1 shows a planar storage capacitor arrangement to illustrate the principles of the invention.

FIG. 1 shows a planar storage capacitor arrangement to illustrate the principles of the invention.

In the case of the outline electrode arrangement shown in FIG. 1, a planar substrate 101 is provided with a substrate layer 102. To form a storage capacitor, a hole is etched into the substrate layer 102 and is then filled with a dielectric 104 and a storage electrode 103.

A counterelectrode to the storage electrode 103 is provided by the substrate 101 which consists, for example, of doped polysilicon. The storage electrode 103 is connected to a drain terminal of a select transistor 105. A source terminal of the select transistor 105 is connected to an electrode connection device 106. The substrate 101 is connected to a substrate connection device 107. In this way, it is possible for the memory cell, which is designed as a storage capacitor, to be driven via a gate terminal of the select transistor 105.

The problem on which the invention is based is explained with reference to the electrode arrangement shown in FIG. 1.

To further increase a storage density for future technology generations, a feature size of arrangements produced by microtechnology is being constantly reduced, leading to a reduction in the size of an active surface area of the storage capacitor. In order to compensate for the associated reduction in the stored charge, it is necessary to increase a capacitance of the storage capacitor.

This can be achieved, for example, by reducing a thickness of the dielectric 104. However, a reduction in a thickness of the dielectric 104 leads to an exponential increase in leakage currents, leading to loss of the information stored in the memory cell.

Figure 2:
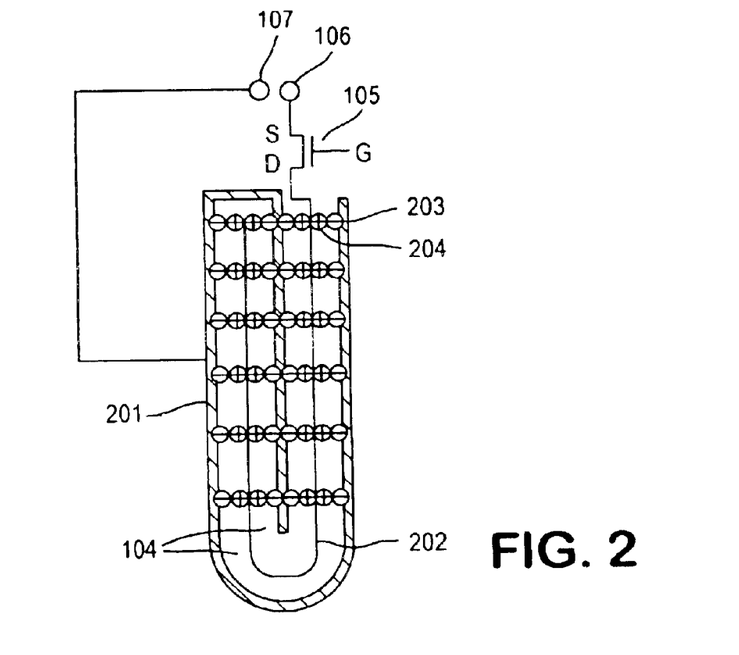
FIG. 2 shows a storage capacitor with a folded storage electrode and an intermediate electrode.

FIG. 2 shows a storage capacitor having a folded storage electrode 201 (substrate electrode, inner trench electrode) and an intermediate electrode 202 (outer trench electrode).

The planar arrangement of the storage capacitor shown in FIG. 1 can be varied in accordance with the invention by selecting a form which deviates from the planar form as the electrode geometry.

In the case of the electrode arrangement for charge storage shown in FIG. 2, a folded storage electrode 201 is provided, FIG. 2 showing a cross-sectional view. A counterelectrode to the folded storage electrode 201 is formed by a correspondingly shaped intermediate electrode 202 which is connected to a drain terminal of the select transistor 105. A source terminal of the select transistor 105 is connected to an electrode connection device 106, by virtue of the fact that an active surface area of the storage capacitor is increased.

In this context, it should be noted that the exemplary embodiment of the electrode arrangement according to the invention does not require a thickness of the dielectric to be reduced, and consequently there is no increase in the leakage current density. In an exemplary embodiment of the present invention, the thicknesses of the dielectric are typically 5 nm, while the thickness of the intermediate electrode is 10–20 nm. The intermediate electrode may, for example, consist of doped polysilicon or of a metal. Therefore, the overall result for the "trench capacitor" electrode arrangement with a diameter of 90 nm, after deposition of the intermediate electrode 202 and of two dielectric layers 104, is a filling region with a diameter of approximately 30–50 nm.

The text which follows will describe the method steps illustrated in FIGS. 4a–4i in more detail. FIGS. 4a to 4i show sectional views which illustrate steps involved in the fabrication of the electrode arrangement in accordance with the invention for charge storage. These figures illustrate individual fabrication steps which constitute a method for fabricating an electrode arrangement according to the invention for charge storage.

Figure 4A:
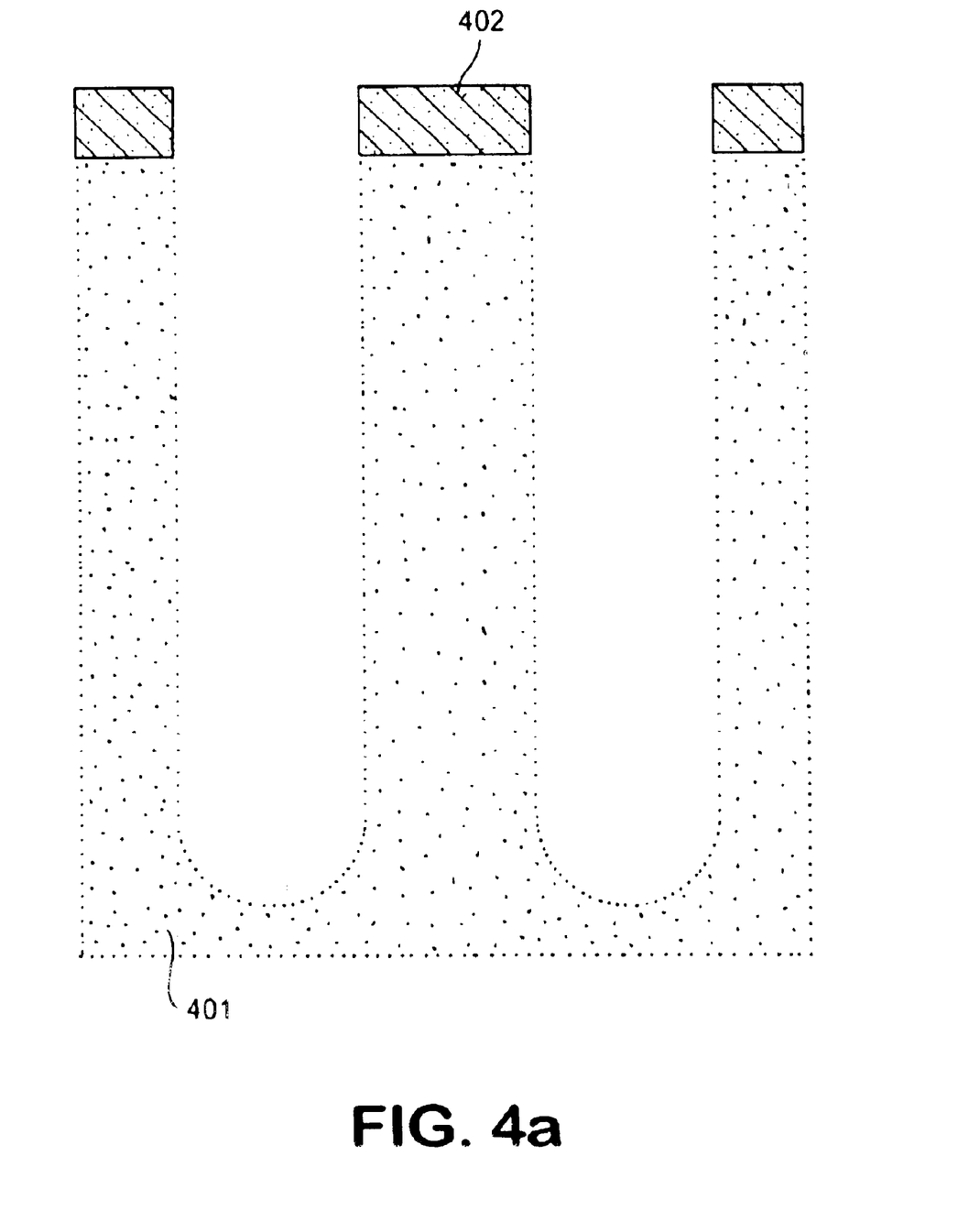
FIGS. 4a–i show sectional views illustrating steps involved in the fabrication of the electrode arrangement according to the invention for charge storage.

FIG. 4a shows two trenches DT which are etched vertically into a substrate material 401 adjacent to one another (DT etching=deep trench etching), the substrate material 401 being covered with a first nitride layer 402. It should be noted that FIGS. 4a–4i are sectional views through two adjacent storage capacitors which form memory cells.

Figure 4B:
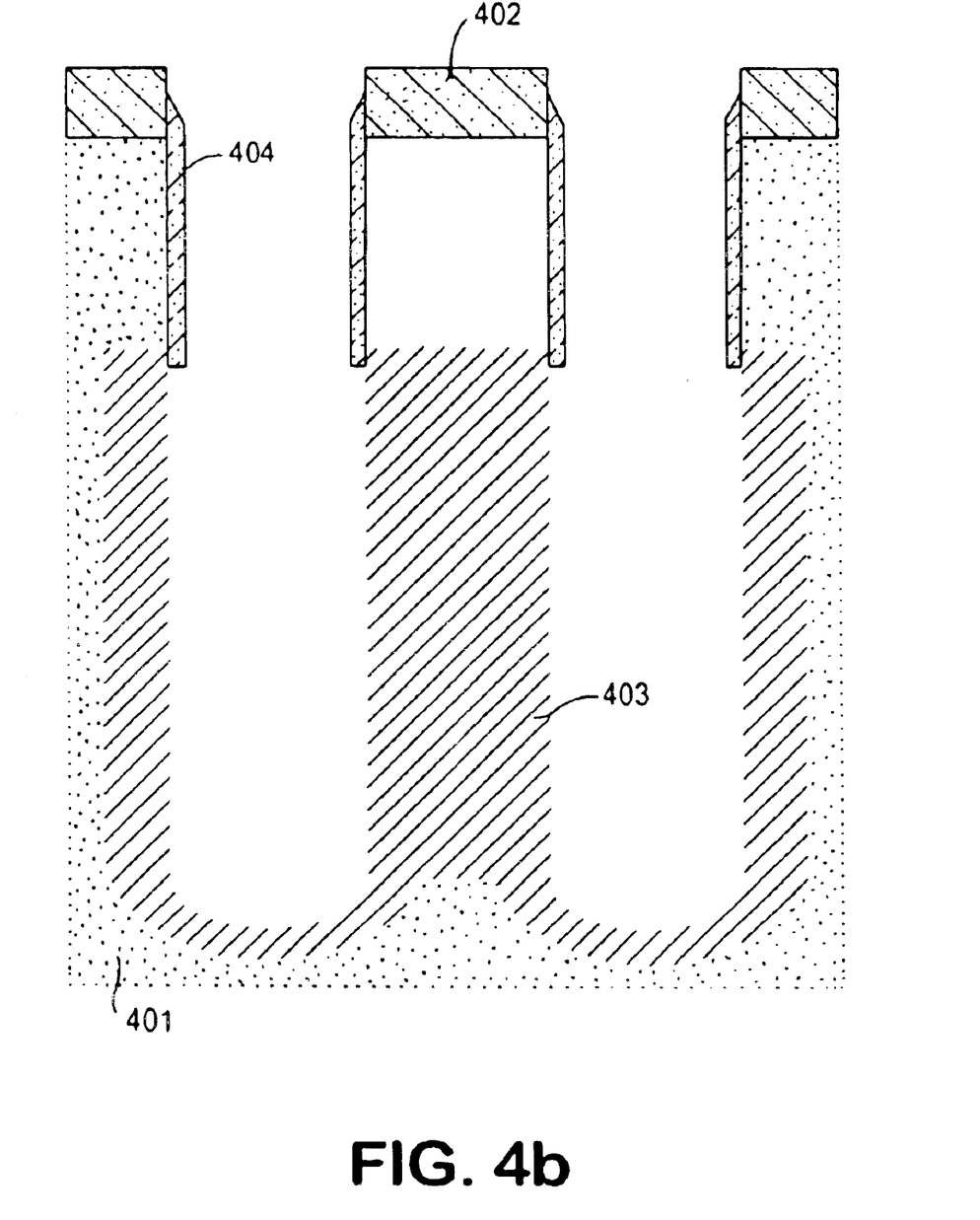

Then, as shown in FIG. 4b, an electrode plate 403 is produced as an electrode surface by means of a "buried plate" doping, specifically by outdiffusion from an As glass or gas phase doping.

An oxide collar layer 404 is applied to the inner walls of the trench between the first nitride layer 402 and the electrode plate 403. Alternatively, this oxide collar layer may also be integrated in buried form, so that the uncovered oxide layer is flush with the inner walls of the trenches.

Figure 4C:
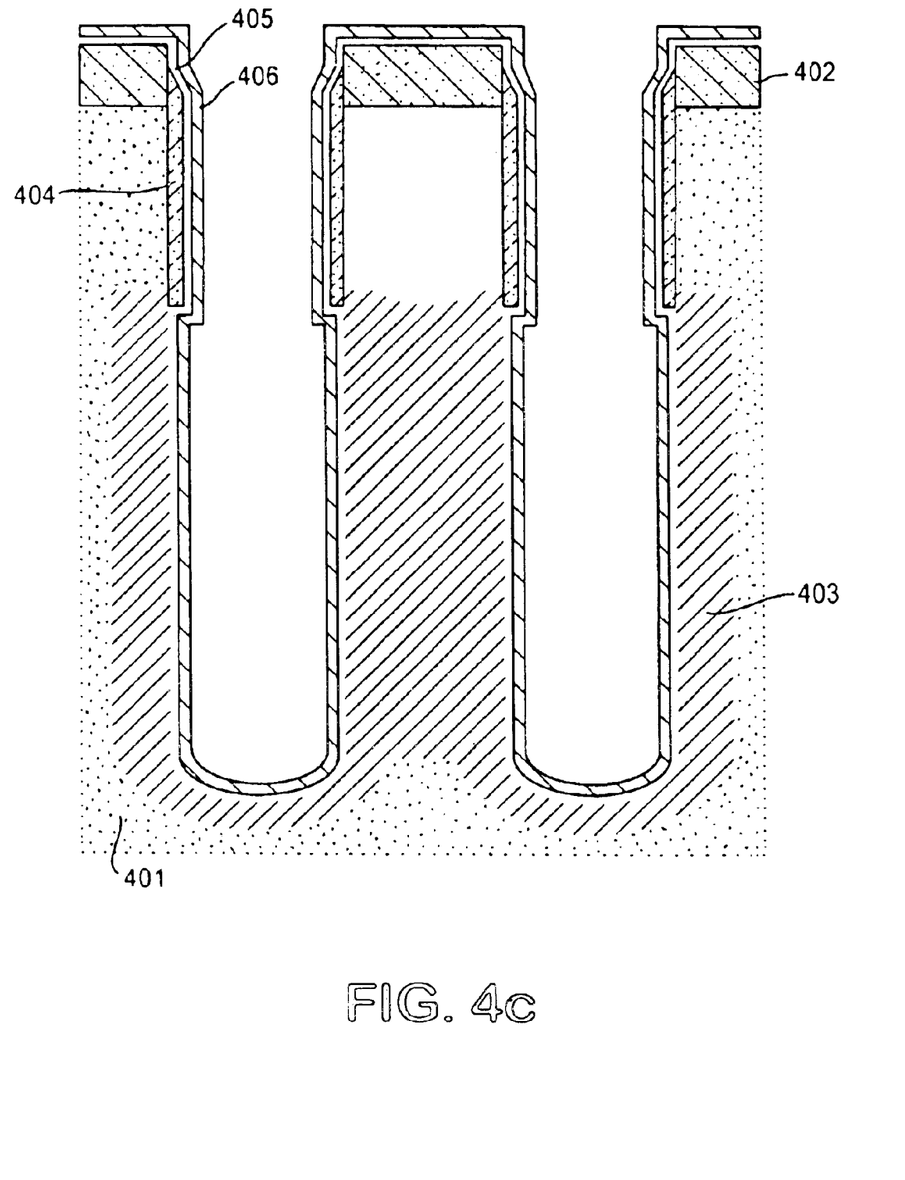

In the next fabrication step, as illustrated in FIG. 4c, a first dielectric layer 405 is applied to the inner surfaces of the trenches, serving as a dielectric for the electrode arrangement which is to be formed as a storage capacitor.

Furthermore, an electrode layer 406, which may consist, for example, of polysilicon or of a metal, is deposited.

Figure 4D:
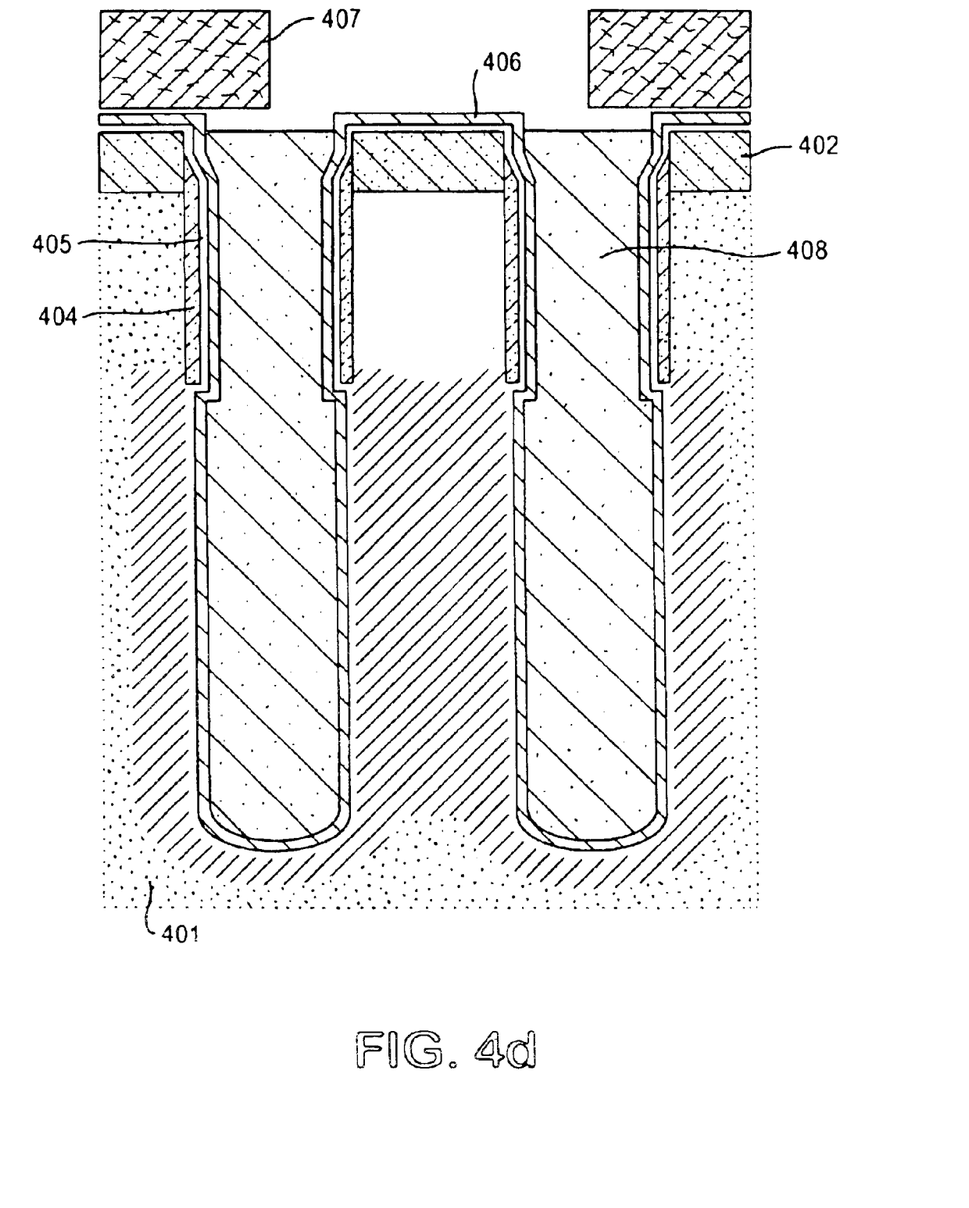

As shown in FIG. 4d, the next fabrication step comprises the application of a lithography mask in the form of a mask layer 407, the mask layer 407 masking the entire area apart from the central part between two trenches, the unmasked region in FIG. 4d being the region which is uncovered centrally between the mask layer 407. Moreover, it can be seen from FIG. 4d that an organic ARC (antireflective coating) layer 408 is introduced into the trenches.

Figure 4E:
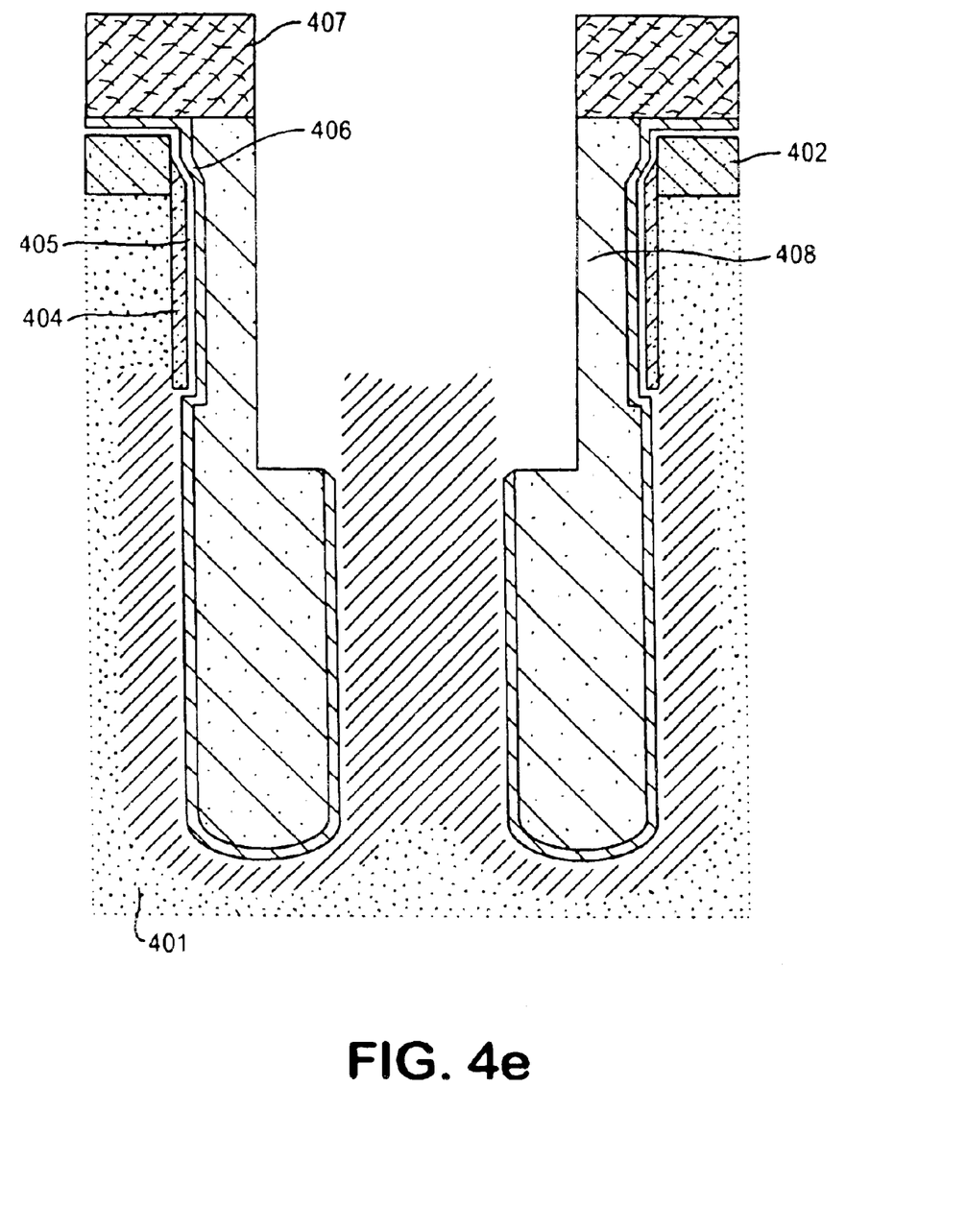

Finally, as shown in FIG. 4e, the antireflection coating 408 is opened up, making it possible to etch the electrode layer 406, the dielectric layer 405 and the oxide collar layer 404 in the central region between two trenches. If appropriate, the electrode layer 406 may have to be etched further by wet-chemical means in the central region in order to uncover the dielectric layer 405, so that the dielectric layer 405 projects above the electrode, as shown in FIG. 4e.

Figure 4F:
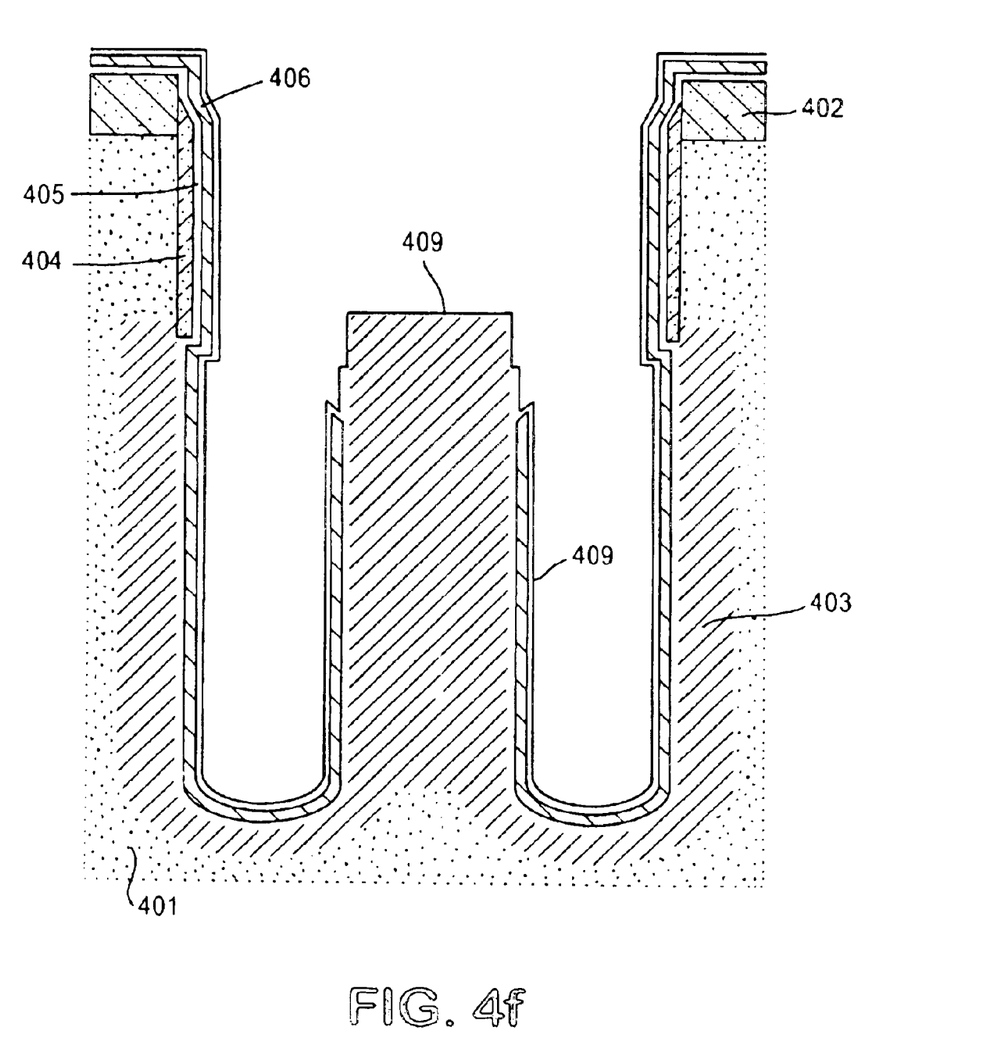

Finally, in the fabrication step shown in FIG. 4f, after removal of the organic ARC, a second dielectric layer 409 is deposited. This second dielectric layer 409 now covers all the exposed surfaces.

Figure 4G:
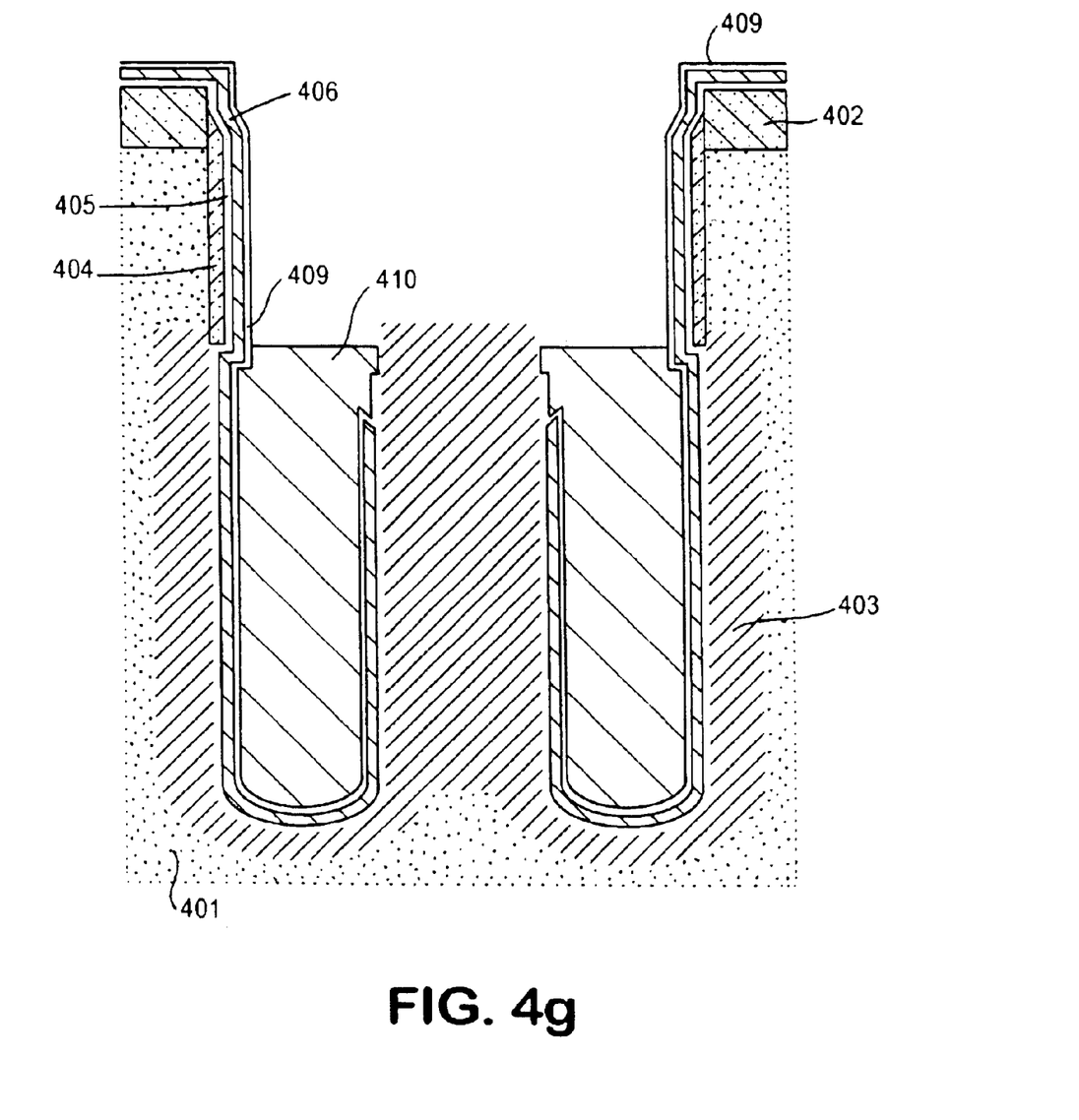

Then, as shown in FIG. 4g, a filling electrode layer 410 is applied in the two trenches illustrated and etched back, the filling electrode layer 410 being used as a third electrode layer in addition to the electrode plate 403 and the electrode layer 406.

Figure 4H:
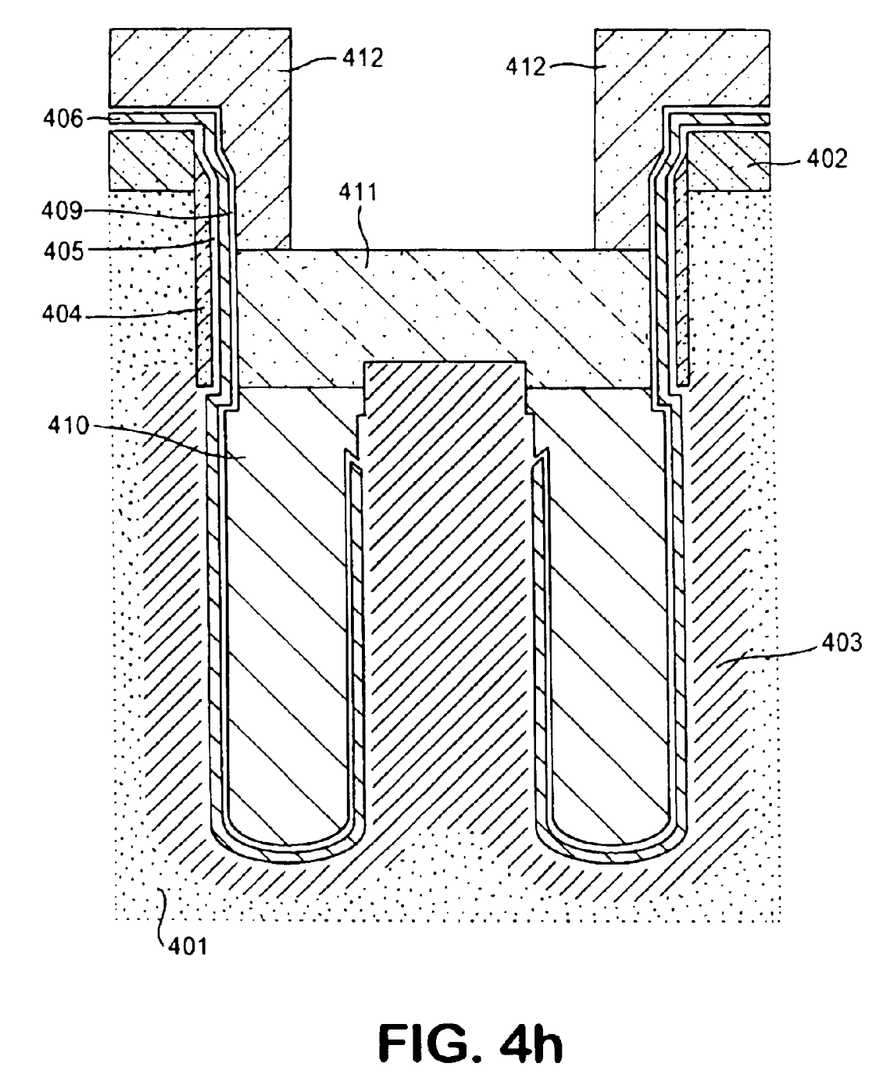

In the next fabrication step, as shown in FIG. 4h, a second oxide layer 411 is deposited above the filled trenches on the filling electrode layer 410 and/or on parts of the second dielectric layer 409 and is etched back. It should be noted that the second oxide layer 411 may also be deposited, for example, by means of an HDP (high-density plasma) process.

As is likewise shown in FIG. 4h, a second nitride layer 412, which is opened up in the central region above the two trenches, is deposited as a mask.

Figure 4I:
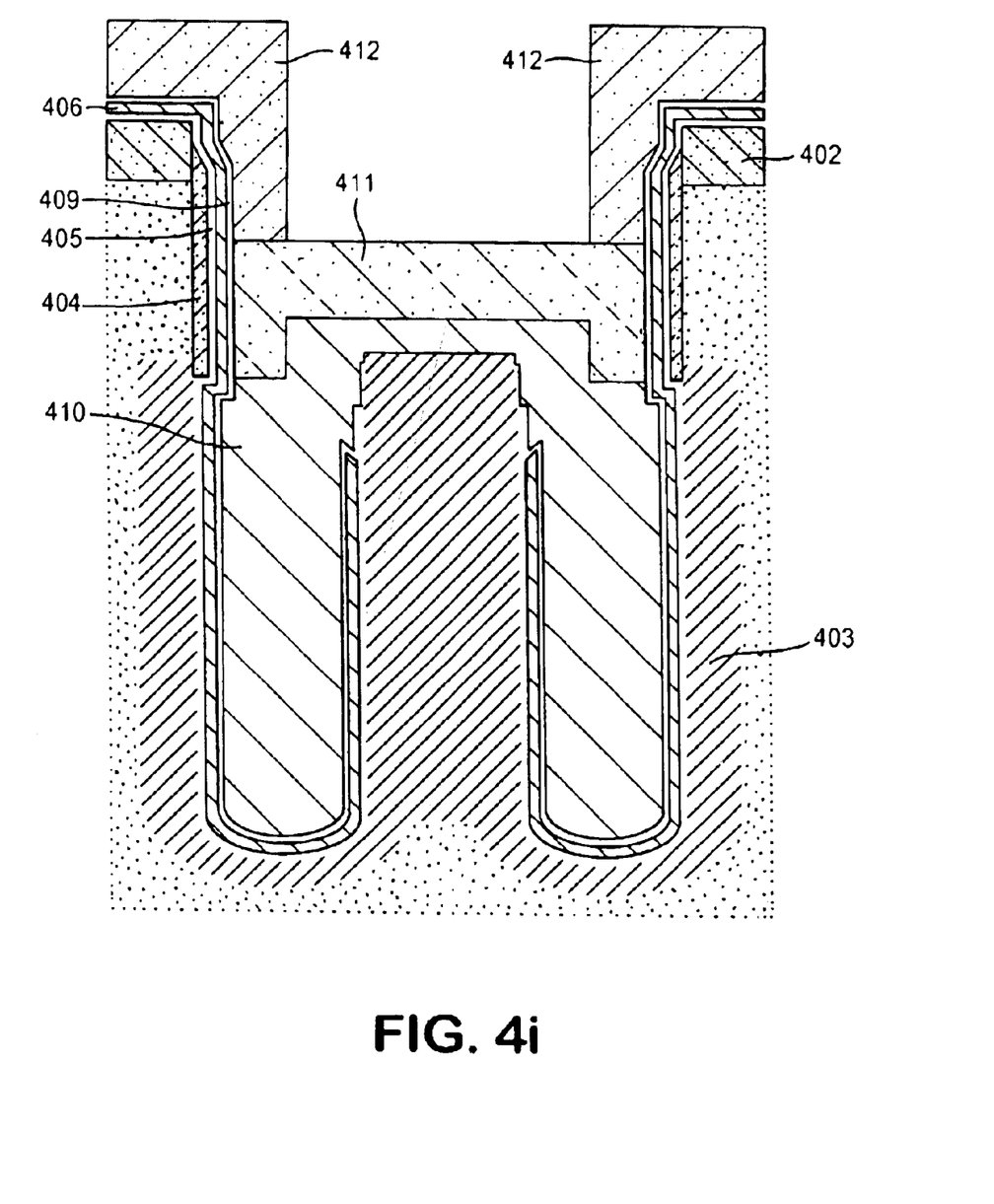

Finally, in the last fabrication step as shown in FIG. 4i, the second oxide layer 411 is removed by dry-chemical means in the unmasked region, with a region of the electrode plate 403 being freed of the second dielectric layer 409, so that subsequent deposition of a filling electrode layer 410 (polysilicon), likewise by HDP deposition, becomes possible.

The deposition of a thin (approx. 1 nm) nitride layer to avoid the propagation of dislocations may optionally take place prior to the deposition of the polysilicon.

In this way, the two trenches filled with the filling electrode layer 410 are electrically connected beneath the second oxide layer 411. The resulting structure is finally filled with HDP oxide.

The result is an electrode arrangement for charge storage as is likewise diagrammatically depicted in FIG. 2.

The electrode arrangements, substrates and terminals shown are illustrated purely by way of example and are not restricted to the sizes and/or size ratios illustrated.

Although the present invention has been described above on the basis of preferred exemplary embodiments, it is not restricted to these embodiments, but rather can be modified in numerous ways.

List of References

101 Substrate
102 Substrate layer
103 Storage electrode
104 Dielectric
105 Select transistor
106 Electrode connection device
107 Substrate connection device
201 Folded storage electrode
202 Intermediate electrode
203 Negative charge units
204 Positive charge units
301 Substrate electrode
302 Filling electrode
401 Substrate material
402 First nitride layer
403 Electrode plate
404 Oxide collar layer
405 First dielectric layer
406 Electrode layer
407 Mask layer
408 Antireflection coating
409 Second dielectric layer
410 Filling electrode layer
411 Second oxide layer
412 Second nitride layer
ARC Antireflective coating
BPC Buried plate self aligned CVD collar
CVD Chemical vapor deposition
DT Deep trench
GDP Gas-phase doping
HDP High-density plasma

What is claimed is:

1. A method for fabricating an electrode arrangement for charge storage, having:

a) an outer trench electrode, which is formed along the wall of a trench provided in a substrate and is electrically insulated in the trench on both sides by a first and second dielectric;

b) an inner trench electrode, which, insulated in the trench by the second dielectric, serves as a counter electrode to the outer trench electrode; and c) a substrate electrode, which, insulated by the first dielectric outside the trench, serves as a counter electrode to the outer trench electrode and which in the upper region of the trench is connected to the inner trench electrode;

which method includes the following steps:

a) forming adjacent trenches in the substrate;

b) providing the substrate electrodes in the lower trench region;

c) forming an oxide collar layer in the upper trench region;

d) applying the first dielectric;

e) providing a first electrode layer corresponding to the outer trench electrodes on the first dielectric;

f) removing the first electrode layer, the first dielectric, the oxide collar layer and the substrate above the substrate electrodes in the central region between pairs of adjacent trenches;

g) applying the second dielectric;

h) introducing a second electrode layer corresponding to the inner trench electrodes into the trenches; and i) providing an electrical connection between the second electrode layers between the pairs of adjacent trenches.

2. The method for fabricating an electrode arrangement for charge storage as claimed in claim 1, wherein a constant thickness of the first and second dielectric is provided in the trench.

3. The method for fabricating an electrode arrangement for charge storage as claimed in claim 1, wherein the inner trench electrode and/or the outer trench electrode is made from doped polysilicon.

4. The method for fabricating an electrode arrangement for charge storage as claimed in claim 1, wherein the inner trench electrode and/or the outer trench electrode is made from a metal.

5. The method for fabricating an electrode arrangement for charge storage as claimed in claim 1, wherein the inner trench electrode and/or the outer trench electrode is made from a metal nitride.

* * * * *